United States Patent
Roewer et al.

(10) Patent No.: US 11,971,316 B2
(45) Date of Patent: Apr. 30, 2024

(54) DIRECTION-DEPENDENT STRESS AND/OR STRAIN MEASUREMENT CELL FOR A STRESS AND/OR STRAIN MEASUREMENT SYSTEM

(71) Applicant: Robert Bosch GmbH, Stuttgart (DE)

(72) Inventors: Falk Roewer, Reutlingen-Betzingen (DE); Clemens Jurgschat, Ehningen (DE); Torsten Ohms, Vaihingen/Enz-Aurich (DE)

(73) Assignee: ROBERT BOSCH GMBH, Stuttgart (DE)

( * ) Notice: Subject to any disclaimer, the term of this patent is extended or adjusted under 35 U.S.C. 154(b) by 71 days.

(21) Appl. No.: 17/825,666

(22) Filed: May 26, 2022

(65) Prior Publication Data
US 2022/0404217 A1  Dec. 22, 2022

(30) Foreign Application Priority Data
Jun. 16, 2021  (DE) ...................... 10 2021 206 134.6

(51) Int. Cl.
*G01L 1/18* (2006.01)
*H01L 27/088* (2006.01)

(52) U.S. Cl.
CPC .............. *G01L 1/18* (2013.01); *H01L 27/088* (2013.01)

(58) Field of Classification Search
CPC ....... G01L 1/2287; G01L 1/18; G01L 9/0098; G01L 1/2293
See application file for complete search history.

(56) References Cited

U.S. PATENT DOCUMENTS

| | | | | |
|---|---|---|---|---|
| 3,492,861 A | * | 2/1970 | Jund | ...................... H01L 27/098 327/516 |
| 4,191,057 A | * | 3/1980 | Busta | ...................... G01R 17/16 73/777 |
| 4,444,054 A | * | 4/1984 | Schaff, Jr. | ........... G01L 19/0084 257/419 |

(Continued)

FOREIGN PATENT DOCUMENTS

| | | |
|---|---|---|
| DE | 102004003853 A1 | 8/2005 |
| DE | 102013100673 A1 | 7/2013 |

(Continued)

*Primary Examiner* — Tran M. Tran
(74) *Attorney, Agent, or Firm* — NORTON ROSE FULBRIGHT US LLP; Gerard A. Messina

(57) ABSTRACT

A stress and/or strain measurement cell for a stress and/or strain measurement system. The cell includes a reference contact, a sensor contact and a first current mirror circuit which is integrated into a semiconductor material and has a first conduction path connectable or connected to the reference contact and a second conduction path connectable or connected to the sensor contact. The first conduction path includes a first transistor and the second conduction path includes a second transistor. A first crystal direction of the semiconductor material oriented perpendicular to a first inversion channel of the first transistor is definable for the first inversion channel and a second crystal direction of the semiconductor material oriented perpendicular to a second inversion channel of the second transistor is definable for the second inversion channel. The first crystal direction of the semiconductor material is inclined relative to the second crystal direction of the semiconductor material.

12 Claims, 5 Drawing Sheets

(56) References Cited

U.S. PATENT DOCUMENTS

| | | | | |
|---|---|---|---|---|
| 4,633,099 A * | 12/1986 | Tanabe | G01L 9/0098 | 257/419 |
| 5,115,292 A * | 5/1992 | Takebe | G01P 15/0802 | 257/254 |
| 5,187,986 A * | 2/1993 | Takebe | G01L 1/005 | 73/497 |
| 5,191,237 A * | 3/1993 | Takebe | G01L 9/0052 | 257/419 |
| 5,279,162 A * | 1/1994 | Takebe | G01P 15/124 | 257/26 |
| 5,281,836 A * | 1/1994 | Mosser | H05B 3/48 | 257/419 |
| 5,381,696 A * | 1/1995 | Ichinose | G01L 1/18 | 73/771 |
| 5,770,803 A * | 6/1998 | Saito | G01P 15/124 | 73/514.16 |
| 6,011,422 A * | 1/2000 | Koglin | H03F 3/45098 | 327/563 |
| 6,538,632 B1 * | 3/2003 | Yamazaki | H03K 17/122 | 330/288 |
| 6,683,358 B1 * | 1/2004 | Ishida | G01P 15/123 | 257/419 |
| 6,774,882 B2 * | 8/2004 | Yamazaki | H01L 27/124 | 330/288 |
| 6,812,590 B2 * | 11/2004 | Lee | G05F 1/569 | 307/37 |
| 7,042,432 B2 * | 5/2006 | Yamazaki | H03K 17/122 | 330/288 |
| 7,088,180 B2 * | 8/2006 | Lee | H03F 3/72 | 330/257 |
| 7,312,485 B2 * | 12/2007 | Armstrong | H01L 29/7843 | 438/50 |
| 7,382,029 B2 * | 6/2008 | Pekarik | H01L 21/823807 | 257/E21.633 |
| 7,406,870 B2 * | 8/2008 | Seto | G01P 15/18 | 73/514.33 |
| 7,525,162 B2 * | 4/2009 | Yin | H01L 29/045 | 257/E21.415 |
| 7,666,720 B2 * | 2/2010 | Pekarik | H01L 21/823807 | 257/E21.632 |
| 7,816,198 B2 * | 10/2010 | Ostermayr | H01L 21/823807 | 257/E29.345 |
| 7,821,331 B2 * | 10/2010 | Krishna | G05F 3/30 | 327/543 |
| 7,832,279 B2 * | 11/2010 | Kautzsch | G01L 13/025 | 73/754 |
| 7,888,710 B2 * | 2/2011 | Armstrong | H01L 27/0922 | 257/369 |
| 7,980,138 B2 * | 7/2011 | Ausserlechner | G01L 25/00 | 73/763 |
| 8,056,421 B2 * | 11/2011 | Sumigawa | G01L 5/0047 | 73/777 |
| 8,171,806 B2 * | 5/2012 | Mizuno | G01L 9/0098 | 73/777 |
| 8,421,435 B2 * | 4/2013 | Hirose | G05F 3/242 | 323/284 |
| 8,487,701 B2 * | 7/2013 | Boujamaa | H03F 3/45273 | 330/288 |
| 8,616,065 B2 * | 12/2013 | Stewart | G01L 9/065 | 73/727 |
| 9,093,988 B2 * | 7/2015 | Yamazaki | H01L 27/0688 | |
| 9,112,484 B1 * | 8/2015 | Clark | G01R 31/2884 | |
| 9,816,883 B2 * | 11/2017 | Kato | G05F 3/26 | |
| 9,960,733 B2 * | 5/2018 | Motz | G01L 1/18 | |
| 10,078,022 B2 * | 9/2018 | Ausserlechner | G01L 1/2281 | |
| 10,133,292 B1 * | 11/2018 | Summers | G05F 3/26 | |
| 10,191,105 B2 * | 1/2019 | Roy | H03F 3/45183 | |
| 10,317,297 B2 * | 6/2019 | Van Der Wiel | G01L 9/0055 | |
| 10,333,463 B2 * | 6/2019 | Motz | G01L 1/00 | |
| 10,393,607 B2 * | 8/2019 | Matsunami | H03K 5/2481 | |
| 10,564,055 B2 * | 2/2020 | Ausserlechner | H01L 29/84 | |
| 10,658,310 B2 * | 5/2020 | Cheng | H10N 30/03 | |
| 10,788,915 B2 * | 9/2020 | Lan | G01L 1/2293 | |
| 10,892,722 B2 * | 1/2021 | Hurwitz | G01R 17/00 | |
| 10,892,757 B1 * | 1/2021 | Kaklin | H10N 19/00 | |
| 11,137,453 B2 * | 10/2021 | Hikichi | G01R 33/0082 | |
| 11,527,705 B2 * | 12/2022 | Burssens | H10N 35/101 | |
| 11,653,568 B2 * | 5/2023 | Haroun | H01L 25/16 | 257/417 |
| 2006/0054927 A1 * | 3/2006 | Wang | H01L 29/812 | 257/194 |
| 2010/0155698 A1 * | 6/2010 | Lieber | G01N 27/4146 | 257/14 |
| 2012/0309142 A1 * | 12/2012 | Miller | H01L 27/098 | 438/188 |
| 2013/0008255 A1 * | 1/2013 | Doelle | G01L 9/105 | 73/708 |
| 2015/0340630 A1 * | 11/2015 | Im | G01L 1/005 | 257/40 |
| 2022/0020915 A1 * | 1/2022 | Nurmetov | H10N 30/302 | |
| 2022/0149856 A1 * | 5/2022 | Park | G01L 1/16 | |
| 2022/0221352 A1 * | 7/2022 | Tanaka | G06F 3/0414 | |
| 2022/0236120 A1 * | 7/2022 | Kollmitz | G01L 1/205 | |
| 2022/0236123 A1 * | 7/2022 | Motz | G01L 1/22 | |
| 2023/0296455 A1 * | 9/2023 | Roisin | H03F 3/45273 | 73/763 |

FOREIGN PATENT DOCUMENTS

| | | |
|---|---|---|
| EP | 2490036 A1 | 8/2012 |
| EP | 3945299 A1 * | 2/2022 |
| JP | 2012181173 A | 9/2012 |

* cited by examiner

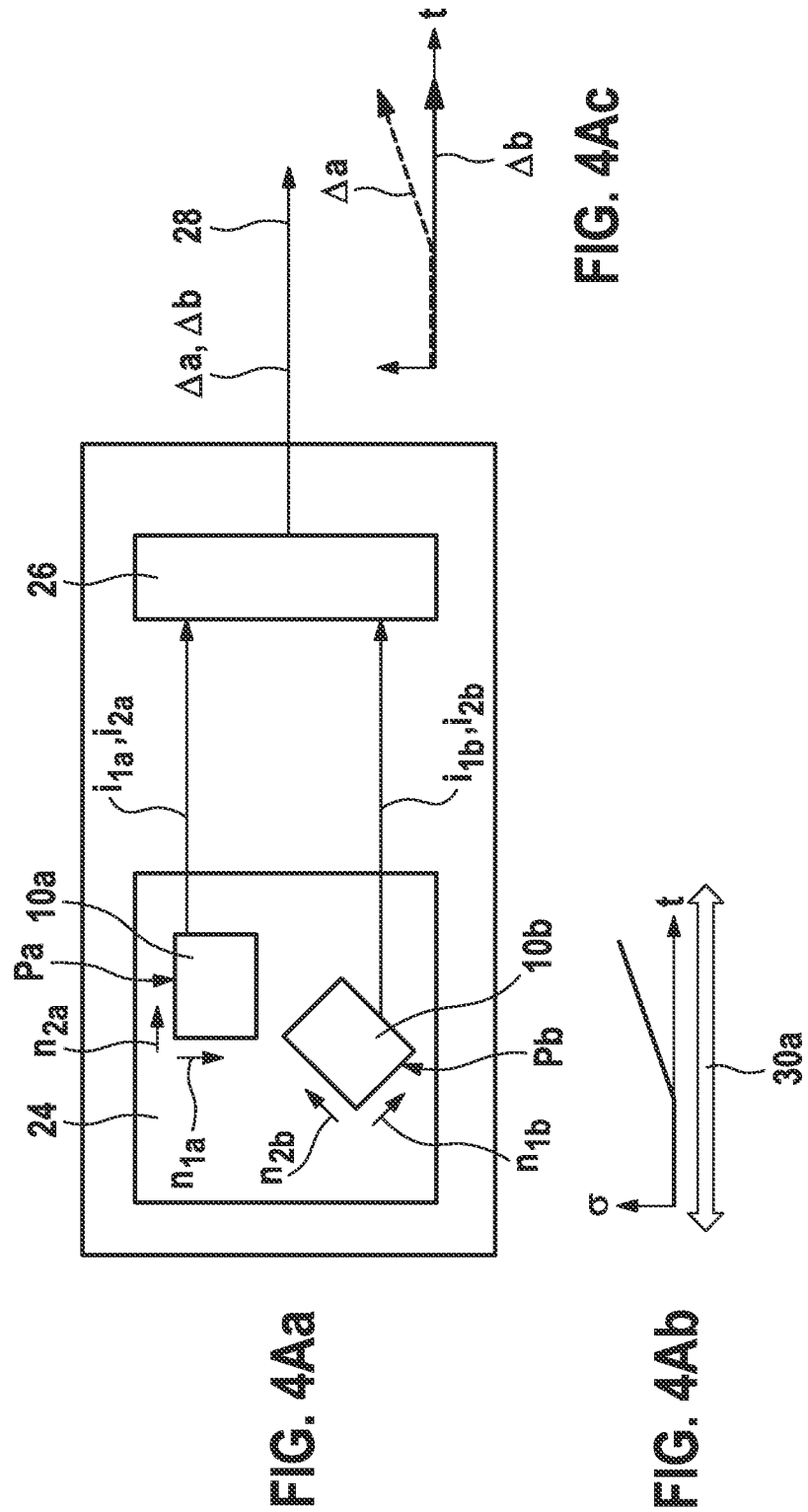

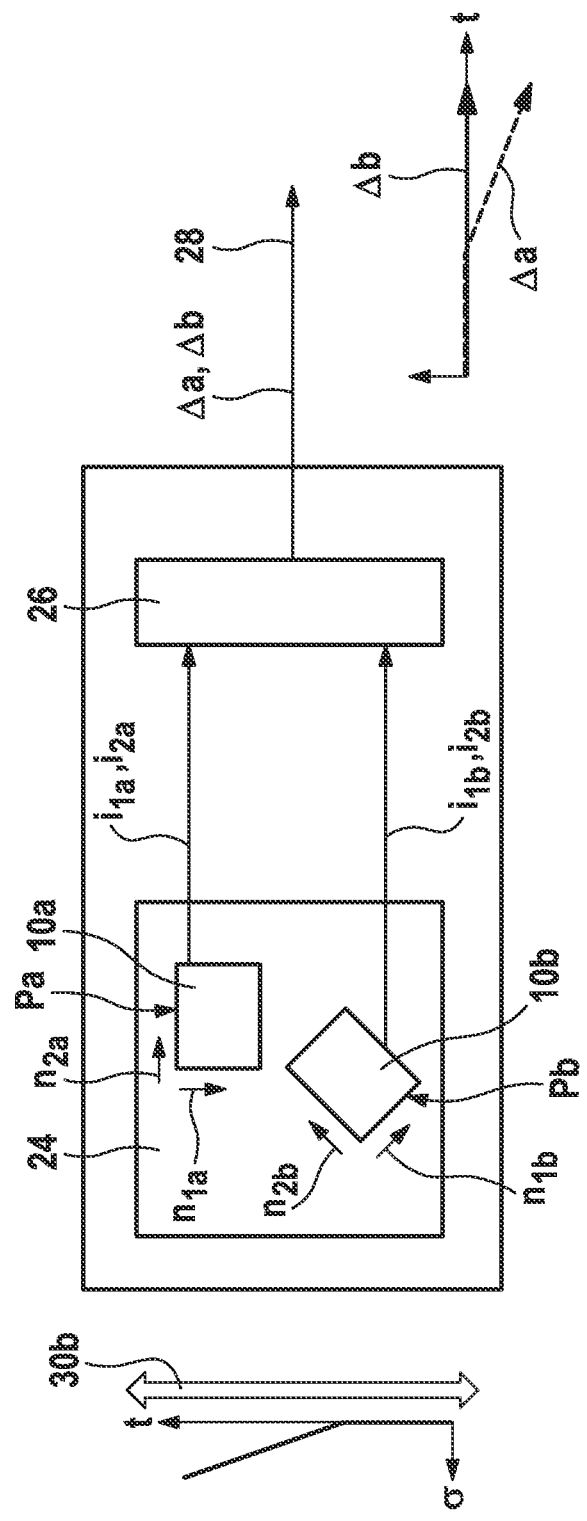

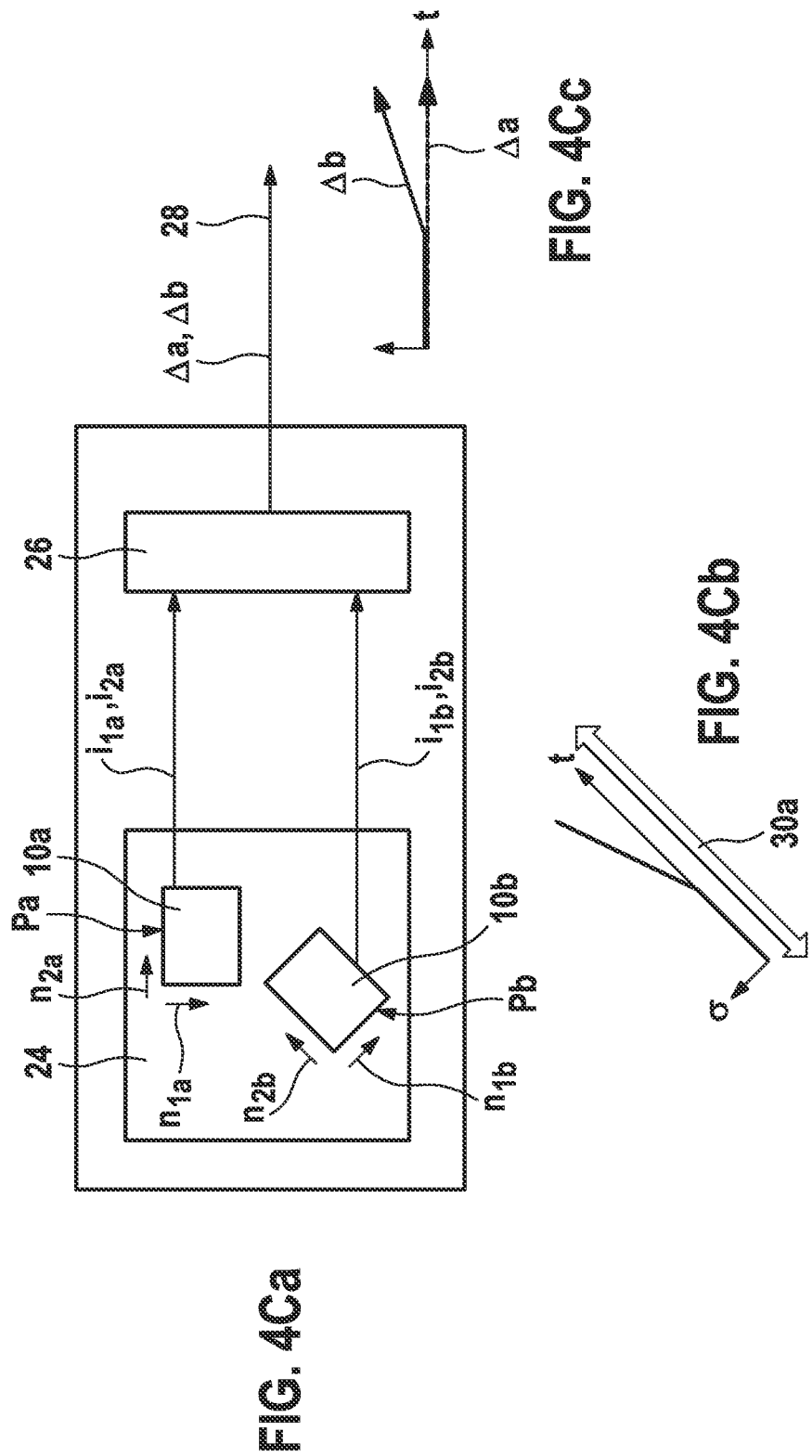

DIRECTION-DEPENDENT STRESS AND/OR STRAIN MEASUREMENT CELL FOR A STRESS AND/OR STRAIN MEASUREMENT SYSTEM

CROSS REFERENCE

The present application claims the benefit under 35 U.S.C. § 119 of German Patent Application No. DE 10 2021 206 134.6 filed on Jun. 16, 2021, which is expressly incorporated herein by reference in its entirety.

FIELD

The present invention relates to a stress and/or strain measurement cell for a stress and/or strain measurement system. The present invention likewise relates to a stress and/or strain measurement system for a semiconductor device. The present invention further relates to a method for determining a direction-dependent item of stress and/or strain information for at least one sensor position of a semiconductor device.

BACKGROUND INFORMATION

European Patent Application No. EP 2 490 036 A1 describes using a Wheatstone-bridge formed of four integrated resistors as a stress sensor for detecting mechanical stresses in a semiconductor chip, wherein two of the resistors are provided with p-type doping and a further two of the resistors with n-type doping.

SUMMARY

The present invention provides a stress and/or strain measurement cell for a stress and/or strain measurement system, a stress and/or strain measurement system for a semiconductor device, and a method for determining a direction-dependent item of stress and/or strain information for at least one sensor position of a semiconductor device.

The present invention provides a stress and/or strain measurement cell which is a space-saving, cost-efficient and temperature-stable alternative to conventional stress sensors. In contrast with the above-explained prior art, a distinctly smaller area is required for forming the stress and/or strain measurement cell according to the present invention. The present invention thus also assists with the miniaturization of a sensor system suitable for detecting stress and/or strain on a semiconductor device. In contrast with piezoresistive components, which are conventionally sometimes also used as stress sensors, the stress and/or strain measurement cell according to the present invention can be produced less expensively, has increased temperature stability and places less stringent requirements on its power supply. All these stated advantages of the stress and/or strain measurement cell according to the present invention thus also increase the usability of the stress and/or strain measurement cell in numerous types of semiconductor devices.

In one advantageous example embodiment of the stress and/or strain measurement cell of the present invention, the first conduction path of the first current mirror circuit additionally further comprises a third transistor connected to the first drain terminal of the first transistor and the second conduction path of the first current mirror circuit additionally further comprises a fourth transistor connected to a second drain terminal of the second transistor, wherein a third gate terminal of the third transistor, a third drain terminal of the third transistor and a fourth gate terminal of the fourth transistor are at an identical potential. Additionally providing the first current mirror circuit with the third transistor and the fourth transistor barely increases its manufacturing costs and installation space requirement but assists in significantly stabilizing its power supply, which increases the reliability of an item of information obtained by evaluating the reference current signal and the sensor current signal of the stress and/or strain measurement cell.

A third crystal direction of the semiconductor material oriented perpendicular to a third inversion channel of the third transistor, which is also oriented perpendicular to a fourth inversion channel of the fourth transistor, is preferably definable for the third inversion channel. It is possible to dispense with using the third inversion channel and fourth inversion channel as stress-sensitive layers. Instead, it is sufficient to use the first inversion channel and second inversion channel as stress-sensitive layers.

In an advantageous further development of the present invention, the stress and/or strain measurement cell may additionally further have a second current mirror circuit integrated into the semiconductor material with a third conduction path connectable or connected to the reference contact or to a further reference contact and with a fourth conduction path connectable or connected to the sensor contact or to a further sensor contact, wherein the third conduction path of the second current mirror circuit comprises at least one fifth transistor and the fourth conduction path of the second current mirror circuit comprises at least one sixth transistor, wherein a fifth gate terminal of the fifth transistor, a fifth drain terminal of the fifth transistor and a sixth gate terminal of the sixth transistor are at an identical potential, wherein a fifth crystal direction of the semiconductor material oriented perpendicular to a fifth inversion channel of the fifth transistor is definable for the fifth inversion channel and a sixth crystal direction of the semiconductor material oriented perpendicular to a sixth inversion channel of the sixth transistor is definable for the sixth inversion channel, the fifth crystal direction of the semiconductor material being inclined relative to the sixth crystal direction of the semiconductor material, and wherein the fifth crystal direction of the semiconductor material is inclined relative to the first crystal direction of the semiconductor material and/or the sixth crystal direction of the semiconductor material is inclined relative to the second crystal direction of the semiconductor material. The described further developed stress and/or strain measurement cell can discriminate between a plurality of differences in stress and/or strain angle. This is an advantageous improvement over a stress and/or strain measurement cell provided with just the first current mirror circuit.

In accordance with an example embodiment of the present invention, more preferably, the third conduction path of the second current mirror circuit additionally further comprises a seventh transistor connected to the fifth drain terminal of the fifth transistor and the fourth conduction path of the second current mirror circuit additionally further comprises an eighth transistor connected to a sixth drain terminal of the sixth transistor, wherein a seventh gate terminal of the seventh transistor, a seventh drain terminal of the seventh transistor and an eighth gate terminal of the eighth transistor are at an identical potential. The power supply of the second current mirror circuit can also be stabilized by means of the seventh transistor and the eighth transistor. The embodiment of the stress and/or strain measurement cell described here thus has elevated stability despite its ability to discriminate between a plurality of differences in stress and/or strain angle.

A seventh crystal direction of the semiconductor material oriented perpendicular to a seventh inversion channel of the seventh transistor, which is also oriented perpendicular to an eighth inversion channel of the eighth transistor, is also definable for the seventh inversion channel. There is no need to use the seventh inversion channel and the eighth inversion channel as stress-sensitive layers.

In another advantageous further development of the present invention, the stress and/or strain measurement cell can additionally further have a switch device which is configured such that, when the switch device is in a first switching state, the first conduction path of the first current mirror circuit is connected to the reference contact and the second conduction path of the first current mirror circuit is connected to the sensor contact and, when the switch device is in a second switching state, the third conduction path of the second current mirror circuit is connected to the reference contact and the fourth conduction path of the second current mirror circuit is connected to the sensor contact. The two current mirror circuits can thus be "read out" in succession by tapping the reference current signal at the reference contact and the sensor current signal at the sensor contact.

Each of the first transistor, the second transistor, the third transistor, the fourth transistor, the fifth transistor, the sixth transistor, the seventh transistor and/or the eighth transistor is preferably a MOSFET. Manufacturing costs and effort can be minimized by using just this type of transistor. Using only this type of transistor likewise ensures uniform temperature effects on the embodiment of the stress and/or strain measurement cell described here.

The previously described advantages are also achievable by means of a stress and/or strain measurement system for a semiconductor device which is provided with at least one such stress and/or strain measurement cell, wherein the semiconductor material of the stress and/or strain measurement cell is arrangeable or arranged on and/or in the semiconductor device at a respective sensor position of the stress and/or strain measurement cell, and with an electronic device which is designed and/or programed to determine, at least on the basis of the reference current signal provided at the reference contact of the stress and/or strain measurement cell and of the sensor current signal provided at the sensor contact of the stress and/or strain measurement cell, a direction-dependent item of stress and/or strain information for at least the sensor position of the stress and/or strain measurement cell.

In an advantageous example embodiment of the present invention, the stress and/or strain measurement system comprises a plurality of stress and/or strain measurement cells as its at least one stress and/or strain measurement cell, wherein the respective semiconductor material of the stress and/or strain measurement cells is arranged at a plurality of sensor positions on and/or in at least one part of the semiconductor device, and wherein the electronic device is designed and/or programed to determine, on the basis of the reference current signals provided at the reference contacts and of the sensor current signals provided at the sensor contacts, an item of information relating to a stress and/or strain distribution on and/or in the at least one part of the semiconductor device as a direction-dependent item of stress and/or strain information.

Carrying out a corresponding method for determining a direction-dependent item of stress and/or strain information for at least one sensor position of a semiconductor device also provides the above-explained advantages. It is expressly stated that the method can be further developed in accordance with the above-explained example embodiments of the stress and/or strain measurement cell and/or of the stress and/or strain measurement system, of the present invention.

BRIEF DESCRIPTION OF THE DRAWINGS

Further features and advantages of the present invention are explained below with reference to the Figures.

FIGS. 4Aa to 4Cc are schematic representations explaining an embodiment of the method for determining a direction-dependent item of stress and/or strain measurement information for at least one sensor position of a semiconductor device, with FIGS. 4Aa and 4Ca showing schematic representations of a stress and/or strain measurement system, FIGS. 4Ab and 4Cb showing a time profile of a stress exerted on the semiconductor device and FIGS. 4Ac and 4Cc showing a time profile of output signals of the stress and/or strain measurement system.

DETAILED DESCRIPTION OF EXAMPLE EMBODIMENTS

Figure 1:
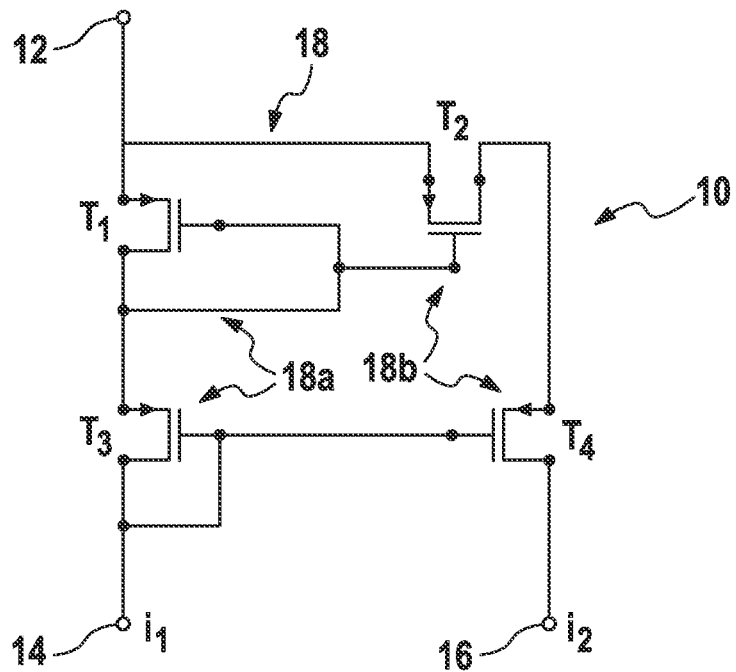
FIG. 1 is a schematic representation of a first example embodiment of the stress and/or strain measurement cell of the present invention.

FIG. 1 shows a schematic representation of a first embodiment of the stress and/or strain measurement cell.

The stress and/or strain measurement cell 10 shown schematically in FIG. 1 has an input contact 12, a reference contact 14 and a sensor contact 16. While the stress and/or strain measurement cell 10 can be supplied with an input current at its input contact 12, a reference current signal $i_1$ from the stress and/or strain measurement cell 10 is provided at its reference contact 14 and a sensor current signal $i_2$ from the stress and/or strain measurement cell 10 is provided at its sensor contact 16. The sensor current signal $i_2$ can also be denoted a "derived current signal" derived from the reference current signal $i_1$. The stress and/or strain measurement cell 10 also has a first current mirror circuit 18 which is integrated/embedded in a semiconductor material (not shown). The semiconductor material may be silicon, for example. Silicon is, however, not the only semiconductor material from which the stress and/or strain measurement cell 10 can be produced. Instead, the semiconductor material can alternatively or additionally to silicon also include at least one further (semiconductor) material. The first current mirror circuit 18 may also be taken to be a first current mirror 18.

The first current mirror circuit 18 moreover has a first conduction path 18a electrically connectable or connected to the reference contact 14 and a second conduction path 18b electrically connectable or connected to the sensor contact 16. The first conduction path 18a and the second conduction path 18b can also in each case be denoted a "leg" of the first current mirror circuit 18. In the embodiment of FIG. 1, the first conduction path 18a is electrically (non-decouplably) connected to the reference contact 14 and the second conduction path 18b to the sensor contact 16. The first conduction path 18a of the first current mirror circuit 18 comprises at least one first transistor $T_1$. The second conduction path 18b of the first current mirror circuit 18 is correspondingly provided with at least one second transistor $T_2$. A first gate terminal of the first transistor $T_1$, a first drain terminal of the first transistor $T_1$ and a second gate terminal of the second transistor $T_2$ are at an identical potential. This is preferably ensured by the first gate terminal of the first transistor $T_1$, the first drain terminal of the first transistor $T_1$ and the second gate terminal of the second transistor $T_2$ being connected together electrically.

A first crystal direction of the semiconductor material which is oriented perpendicular to a first inversion channel of the first transistor $T_1$ is defined/definable for the first inversion channel of the first transistor $T_1$. A second inversion channel of the second transistor $T_2$ is also configured such that a second crystal direction of the semiconductor material is oriented perpendicular to the second inversion channel of the second transistor $T_2$. It is expressly stated here that the first crystal direction of the semiconductor material oriented perpendicular to the first inversion channel of the first transistor $T_1$ extends inclined relative to the second crystal direction of the semiconductor material oriented perpendicular to the second inversion channel of the second transistor $T_2$. A first angle of inclination between the first crystal direction of the semiconductor material and the second crystal direction of the semiconductor material is greater than 0° and less than or equal to 90°. The first angle of inclination between the first crystal direction of the semiconductor material and the second crystal direction of the semiconductor material is preferably greater than 20° and less than or equal to 90°, more preferably greater than 40° and less than or equal to 90°. In particular, the first crystal direction of the semiconductor material can be oriented perpendicular to the second crystal direction of the semiconductor material. For example, the first crystal direction oriented perpendicular to the first inversion channel of the first transistor $T_1$ may be the [110] crystal direction of the silicon used as the semiconductor material and the second crystal direction oriented perpendicular to the second inversion channel of the second transistor $T_2$ may be the [1-10] crystal direction of the silicon. The crystal directions stated here should, however, only be interpreted as being stated by way of example. The mutually differing orientations of the inversion channels of the first transistor $T_1$ and of the second transistor $T_2$ can also be paraphrased as the first transistor $T_1$ and the second transistor $T_2$ of the first current mirror circuit 18 having a "twisted" orientation to one another.

If mechanical stresses arise in the semiconductor material with the first current mirror circuit 18 embedded therein, such as for example in the event of stress and/or strain, the mechanical stresses bring about a change in charge carrier mobility in the inversion channels of transistors $T_1$ and $T_2$. However, due to the different orientation of the inversion channels of transistors $T_1$ and $T_2$ (in relation to the crystal structure of the semiconductor material), the mechanical stresses bring about non-identical changes in charge carrier mobility in the inversion channels of transistors $T_1$ and $T_2$. A difference between a change in charge carrier mobility in the first inversion channel of the first transistor $T_1$ and a change in charge carrier mobility in the second inversion channel of the second transistor $T_2$ is for, example, dependent on the direction of orientation of the inversion channels of transistors $T_1$ and $T_2$ (in relation to the crystal structure of the semiconductor material), a direction of the mechanical stresses, an applied source voltage at each of transistors $T_1$ and $T_2$, an applied gate voltage at each of transistors $T_1$ and $T_2$, an applied drain voltage at each of transistors $T_1$ and $T_2$, and on minority carrier mobility of transistors $T_1$ and $T_2$. The non-identical changes in charge carrier mobility in the inversion channels of transistors $T_1$ and $T_2$ moreover result in non-identical changes to the reference current signal $i_1$ of the stress and/or strain measurement cell 10 and to the sensor current signal $i_2$ of the stress and/or strain measurement cell 10, or in a variation of a difference $\Delta$ of the reference current signal $i_1$ minus the sensor current signal $i_2$. Since the difference $\Delta$ of the reference current signal $i_1$ minus the sensor current signal $i_2$ is dependent on the different orientations of the inversion channels of transistors $T_1$ and $T_2$, it is hereafter denoted angle-dependent stress difference $\Delta$.

The first inversion channel of the first transistor $T_1$ and the second inversion channel of the second transistor $T_2$ can thus be utilized as stress-sensitive layers for detecting mechanical stresses. The first current mirror circuit 18 thus has stress and strain sensitivity which is dependent on the different orientations of the inversion channels of transistors $T_1$ and $T_2$ (in relation to the crystal structure of the semiconductor material), which can be utilized not only for detecting mechanical stresses, but also for determining the direction of the mechanical stresses. Alternatively, either the change in reference current signal $i_1$ of the stress and/or strain measurement cell 10 triggered by the mechanical stresses together with the change in sensor current signal $i_2$ of the stress and/or strain measurement cell 10 likewise triggered by the mechanical stresses or only the change in angle-dependent stress difference $\Delta$ can be evaluated for this purpose. The first current mirror circuit 18 can therefore also be denoted first piezoresistive current mirror circuit 18. It is expressly stated here that the different orientations of the inversion channels of transistors $T_1$ and $T_2$ can be freely selected and therefore the stress and strain sensitivity of the first current mirror circuit 18 which is dependent thereon can advantageously be "optimized" for any desired stress directions.

In the stress and/or strain measurement cell of FIG. 1, the first conduction path 18a of the first current mirror circuit 18 is advantageously further additionally provided with a third transistor $T_3$ connected to the first drain terminal of the first transistor $T_1$. Correspondingly, the second conduction path 18b of the first current mirror circuit 18 also additionally further comprises a fourth transistor $T_4$ connected to a second drain terminal of the second transistor $T_2$. As FIG. 1 shows diagrammatically, a third gate terminal of the third transistor $T_3$, a third drain terminal of the third transistor $T_3$ and a fourth gate terminal of the fourth transistor $T_4$ are at an identical potential. This is achieved by the third gate terminal of the third transistor $T_3$, the third drain terminal of the third transistor $T_3$ and the fourth gate terminal of the fourth transistor $T_4$ being connected together electrically.

The further development of the first current mirror circuit 18 with the third transistor $T_3$ and the fourth transistor $T_4$ creates a cascoded power supply of first current mirror circuit 18 which advantageously assists in stabilizing the current signals $i_1$ and $i_2$ provided at the first current mirror circuit 18. This ensures reliable stability of the power supply of the first current mirror circuit 18 despite its stress and strain sensitivity. Although it is frequently the case for an integrated circuit, into which class the first current mirror circuit 18 falls, that a stable operating point for performing undistorted measurements is not ensured, this frequent deficiency of integrated circuits in the first current mirror circuit 18 is remedied by its cascoded power supply. The first current mirror circuit 18 can therefore also be denoted a cascoded current mirror circuit 18.

A third/fourth crystal direction of the semiconductor material oriented perpendicular to a third inversion channel of the third transistor $T_3$, which is also oriented perpendicular to a fourth inversion channel of the fourth transistor $T_4$, is preferably determinable for the third inversion channel of the third transistor $T_3$. Non-identical orientations of the third inversion channel of the third transistor $T_3$ and of the fourth inversion channel of the fourth transistor $T_4$ (in relation to the crystal structure of the semiconductor material) are thus not necessary.

The first transistor $T_1$, the second transistor $T_2$, the third transistor $T_3$ and/or the fourth transistor $T_4$ are preferably each a MOSFET. For example, the first transistor $T_1$, the second transistor $T_2$, the third transistor $T_3$ and/or the fourth transistor $T_4$ are each a p-MOSFET. Alternatively, the first transistor $T_1$, the second transistor $T_2$, the third transistor $T_3$ and/or the fourth transistor $T_4$ can each be an n-MOSFET. By using just one type of transistor, manufacturing costs and effort for the stress and/or strain measurement cell 10 of FIG. 1 can be minimized. Using just one type of transistor likewise ensures uniform temperature effects of the stress and/or strain measurement cell 10 of FIG. 1.

Figure 2:
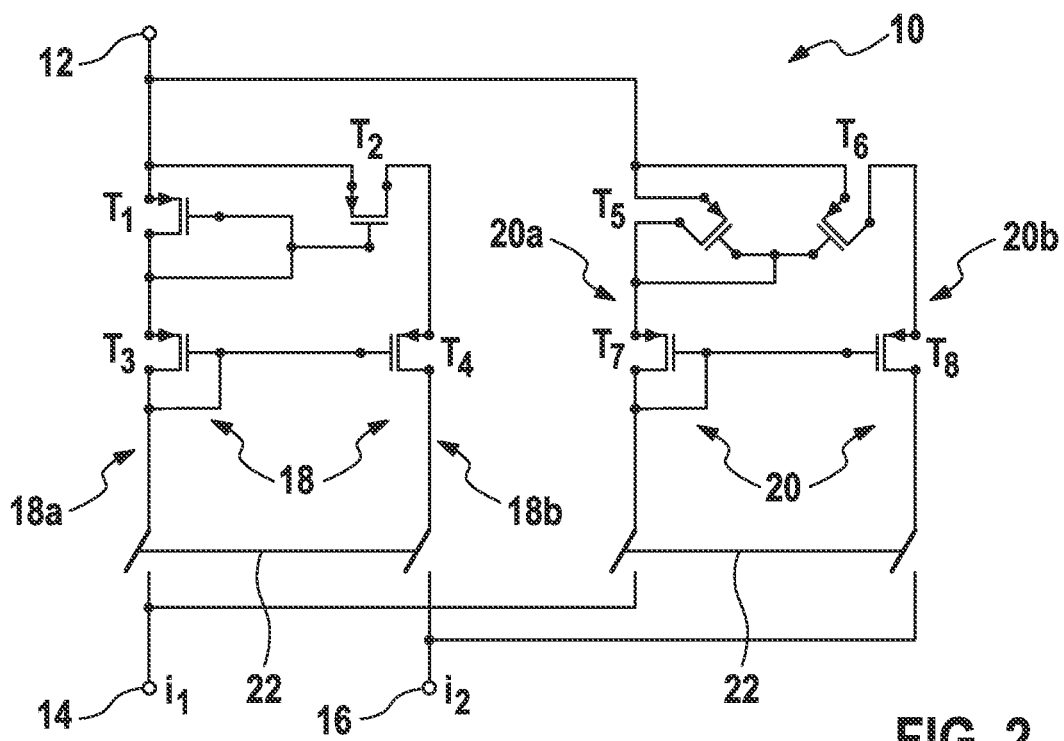
FIG. 2 is a schematic representation of a second example embodiment of the stress and/or strain measurement cell of the present invention.

FIG. 2 shows a schematic representation of a second embodiment of the stress and/or strain measurement cell.

The stress and/or strain measurement cell 10 of FIG. 2 additionally further has, as a complement to the previously described embodiment, a second current mirror circuit 20 integrated into the semiconductor material with a third conduction path 20*a* connectable or connected to the reference contact 14 or to a further reference contact and with a fourth conduction path 20*b* connectable or connected to the sensor contact 16 or to a further sensor contact. The third conduction path 20*a* of the second current mirror circuit 20 has at least one fifth transistor $T_5$. The fourth conduction path 20*b* of the second current mirror circuit 20 correspondingly comprises at least one sixth transistor $T_6$. As is apparent from FIG. 2, a fifth gate terminal of the fifth transistor $T_5$, a fifth drain terminal of the fifth transistor $T_5$ and a sixth gate terminal of the sixth transistor $T_6$ are at an identical potential, which is specifically achieved by means of an electrical connection of the fifth gate terminal of the fifth transistor $T_5$, of the fifth drain terminal of the fifth transistor $T_5$ and of the sixth gate terminal of the sixth transistor $T_6$.

A fifth crystal direction of the semiconductor material which is oriented perpendicular to a fifth inversion channel of the fifth transistor $T_5$ is defined/definable for the fifth inversion channel of the fifth transistor $T_5$. A sixth crystal direction of the semiconductor material oriented perpendicular to a sixth inversion channel of the sixth transistor $T_6$ is correspondingly also determinable for the sixth inversion channel, wherein the sixth crystal direction of the semiconductor material extends inclined relative to the fifth crystal direction of the semiconductor material. A second angle of inclination between the fifth crystal direction of the semiconductor material and the sixth crystal direction of the semiconductor material is preferably greater than 20° and less than or equal to 90°, more preferably greater than 40° and less than or equal to 90°. In particular, the fifth crystal direction of the semiconductor material can be oriented perpendicular to the sixth crystal direction of the semiconductor material. Moreover, the fifth crystal direction of the semiconductor material is inclined relative to the first crystal direction of the semiconductor material and/or the sixth crystal direction of the semiconductor material is inclined relative to the second crystal direction of the semiconductor material. More preferably, a third angle of inclination between the fifth crystal direction of the semiconductor material and the first crystal direction of the semiconductor material and/or a fourth angle of inclination between the sixth crystal direction of the semiconductor material and the second crystal direction of the semiconductor material are greater than 20° and less than or equal to 90°, specifically greater than 40° and less than or equal to 90°. Moreover it is sometimes advantageous for the second crystal direction of the semiconductor material to be rotated about a first axis of rotation in relation to the first crystal direction of the semiconductor material, while the fifth crystal direction of the semiconductor material in relation to the first crystal direction of the semiconductor material and/or the sixth crystal direction of the semiconductor material in relation to the second crystal direction are rotated about a second axis of rotation which is oriented inclined relative to the first axis of rotation. The second axis of rotation can in particular be oriented perpendicular to the first axis of rotation.

The two current mirror circuits 18 and 20 can be used as piezoresistive current mirror circuits 18 and 20. Providing the stress and/or strain measurement cell 10 of FIG. 2 with the two current mirror circuits 18 and 20 means that its stress and strain sensitivity is increased for further stress directions in comparison with the stress and strain sensitivity of the first current mirror circuit 18 alone. The stress and/or strain measurement cell 10 shown in FIG. 2 can, as a further development, further have at least one third current mirror circuit which in each case has at least some of the above-described features of the second current mirror circuit 20. The stress and strain sensitivity of the stress and/or strain measurement cell 10 can be additionally optimized by concatenating at least three current mirror circuits of different orientations.

As an advantageous further development of the stress and/or strain measurement cell 10 of FIG. 2, the third conduction path 20*a* of the second current mirror circuit 20 also comprises a seventh transistor $T_7$ connected to the fifth drain terminal of the fifth transistor $T_5$ and the fourth conduction path 20*b* of the second current mirror circuit 20 also comprises an eighth transistor $T_8$ connected to a sixth drain terminal of the sixth transistor $T_6$, wherein a seventh gate terminal of the seventh transistor $T_7$, a seventh drain terminal of the seventh transistor $T_7$ and an eighth gate terminal of the eighth transistor $T_8$ are at an identical potential. The two current mirror circuits 18 and 20 thus have the advantages already described above of a cascoded power supply and can therefore be denoted cascoded current mirror circuits 18 and 20. Moreover, a seventh/eighth crystal direction of the semiconductor material oriented perpendicular to a seventh inversion channel of the seventh transistor $T_7$, which is also oriented perpendicular to an eighth inversion channel of the eighth transistor $T_8$, can be determinable for the seventh inversion channel of the seventh transistor $T_7$. Non-identical orientations of the seventh inversion channel of the seventh transistor $T_7$ and of the eighth inversion channel of the eighth transistor $T_8$ (in relation to the crystal structure of the semiconductor material) are thus not necessary.

The stress and/or strain measurement cell 10 of FIG. 2 additionally also has a switch device 22 which is configured such that, when the switch device 22 is in a first switching state, the first conduction path 18*a* of the first current mirror circuit 18 is connected to the reference contact 14 and the second conduction path 18*b* of the first current mirror circuit 18 is connected to the sensor contact 16 and, when the switch device 22 is in a second switching state, the third conduction path 20*a* of the second current mirror circuit 20 is connected to the reference contact 14 and the fourth conduction path 20b of the second current mirror circuit 20 is connected to the sensor contact 16. By using the switch device 22, it is possible to "select" between the stress and strain sensitivity of the first current mirror circuit 18 and the stress and strain sensitivity of the second current mirror circuit 20 for the stress and/or strain measurement cell 10. This can also provide additional information for determining the direction of the mechanical stresses. The reference current signal $i_1$ provided at reference contact 14 and the sensor current signal $i_2$ provided at sensor contact 16 can be individually evaluated for each switching state of the switch device 22 for evaluation of the stress and/or strain measurement cell of FIG. 2. Preferably, however, the angle-dependent stress difference $\Delta$ already defined above is evaluated for each switching state of the switch device 22, which assists with reducing component scatter effects.

The first transistor $T_1$, the second transistor $T_2$, the third transistor $T_3$, the fourth transistor $T_4$, the fifth transistor $T_5$, the sixth transistor $T_6$, the seventh transistor $T_7$ and/or the eighth transistor $T_8$ are preferably each a MOSFET in the stress and/or strain measurement cell 10 of FIG. 2 as well. The first transistor $T_1$, the second transistor $T_2$, the third transistor $T_3$, the fourth transistor $T_4$, the fifth transistor $T_5$, the sixth transistor $T_6$, the seventh transistor $T_7$ and/or the eighth transistor $T_8$ can each be a p-MOSFET. Alternatively, the first transistor $T_1$, the second transistor $T_2$, the third transistor $T_3$, the fourth transistor $T_4$, the fifth transistor $T_5$, the sixth transistor $T_6$, the seventh transistor $T_7$ and/or the eighth transistor $T_8$ can each be an n-MOSFET. As a result of using just one type of transistor, manufacturing costs are reduced, manufacturing effort lowered and temperature effects minimized for the stress and/or strain measurement cell 10 of FIG. 2 as well.

Figure 3:
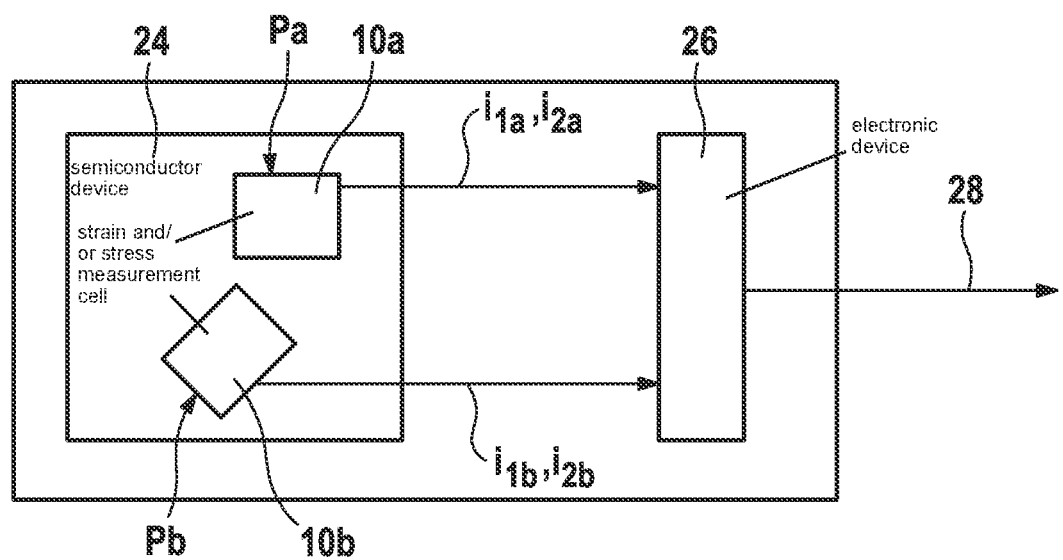
FIG. 3 is a schematic representation of one example embodiment of the stress and/or strain measurement system of the present invention.

FIG. 3 is a schematic representation of one embodiment of the stress and/or strain measurement system.

The stress and/or strain measurement system shown schematically in FIG. 3 can be used for a semiconductor device 24 in order to detect the occurrence of stress and/or strain at at least one sensor position Pa and Pb of the semiconductor device 24. For this purpose, the stress and/or strain measurement system has at least one stress and/or strain measurement cell 10a and 10b, wherein the semiconductor material of the stress and/or strain measurement cell 10a and 10b is arrangeable/arranged on and/or in the semiconductor device 24 at a respective sensor position Pa and Pb of the stress and/or strain measurement cell 10a or 10b. The semiconductor device 24 may be, for example, a micromechanical component, a control device and/or a sensor device, such as in particular an inertial sensor. It is, however, expressly stated that usability of the stress and/or strain measurement system is not limited to the examples of semiconductor device 24 stated here.

The stress and/or strain measurement system also has an electronic device 26 which is designed and/or programmed to determine, at least on the basis of the reference current signal $i_{1a}$ and $i_{1b}$ provided at the reference contact of the stress and/or strain measurement cell 10a or 10b and of the sensor current signal $i_{2a}$ and $i_{2b}$ provided at the sensor contact of the stress and/or strain measurement cell 10a or 10b, a direction-dependent item of stress and/or strain information 28 for at least the sensor position Pa and Pb of the stress and/or strain measurement cell 10a or 10b. In an advantageous further development, the stress and/or strain measurement system may comprise a plurality of stress and/or strain measurement cells 10a or 10b, wherein the respective semiconductor material of the stress and/or strain measurement cells 10a or 10b is arranged on and/or in at least one part of the semiconductor device 24 at a plurality of sensor positions Pa and Pb. The electronic device 26 may in this case be designed and/or programed to determine, on the basis of the reference current signals $i_{1a}$ and $i_{1b}$ provided at the reference contacts and of the sensor current signals $i_{2a}$ and $i_{2b}$ provided at the sensor contacts, an item of information relating to a stress and/or strain distribution on and/or in the at least one part of the semiconductor device 24 as a direction-dependent item of stress and/or strain information 28. In particular, the stress and/or strain measurement system may be designed and/or programed to carry out at least some of the method steps described below.

FIGS. 4Aa to 4Cc are schematic representations explaining an embodiment of the method for determining a direction-dependent item of stress and/or strain measurement information for at least one sensor position of a semiconductor device, with FIGS. 4Aa and 4Ca showing schematic representations of a stress and/or strain measurement system, FIGS. 4Ab and 4Cb showing a time profile of a stress exerted on the semiconductor device and FIGS. 4Ac and 4Cc showing a time profile of output signals of the stress and/or strain measurement system.

At the beginning of the method, at least one stress and/or strain measurement cell 10a and 10b with a reference contact, a sensor contact and a first current mirror circuit, which is integrated into a semiconductor material and has a first conduction path connectable or connected to the reference contact and a second conduction path connectable or connected to the sensor contact, wherein the first conduction path of the first current mirror circuit comprises at least one first transistor and the second conduction path of the first current mirror circuit comprises at least one second transistor, and wherein a first gate terminal of the first transistor, a first drain terminal of the first transistor and a second gate terminal of the second transistor are at an identical potential, is arranged in such a manner at the sensor position Pa and Pb that the semiconductor material of the stress and/or strain measurement cell 10a and 10b is located on and/or in the semiconductor device 24 at sensor position Pa and Pb. As FIGS. 4Aa to 4Ca show diagrammatically, it is ensured when arranging the at least one stress and/or strain measurement cell 10a and 10b at its sensor position Pa and Pb that a first crystal direction $n_{1a}$ and $n_{1b}$ of the semiconductor material oriented perpendicular to a first inversion channel of its first transistor $T_1$ is in each case definable for the first inversion channel of its first transistor $T_1$ and a second crystal direction $n_{2a}$ and $n_{2b}$ of the semiconductor material oriented perpendicular to a second inversion channel of its second transistor $T_2$ is in each case definable for the second inversion channel of its second transistor $T_2$, wherein the first crystal direction $n_{1a}$ and $n_{1b}$ of the semiconductor material for the at least one stress and/or strain measurement cell 10a and 10b extends inclined relative to the second crystal direction $n_{2a}$ and $n_{2b}$ of the semiconductor material of the same stress and/or strain measurement cell 10a and 10b. In particular, a plurality of stress and/or strain measurement cells 10a and 10b may be arranged such that the respective semiconductor material of the stress and/or strain measurement cells 10a and 10b is located on and/or in at least one part of the semiconductor device 24 at a plurality of sensor positions Pa and Pb. Not only can the definable first crystal directions $n_{1a}$ and $n_{1b}$ be oriented differently from one another but also the definable second crystal directions $n_{2a}$ and $n_{2b}$ can be oriented differently from one another for the plurality of stress and/or strain measurement cells 10a and 10b as well.

The direction-dependent item of stress and/or strain information 28 for at least the sensor position Pa and Pb of the stress and/or strain measurement cell 10a and 10b is then determined at least on the basis of a reference current signal $i_{1a}$ and $i_{1b}$ provided at the reference contact of the stress and/or strain measurement cell and of a sensor current signal $i_{2a}$ and $i_{2b}$ provided at the sensor contact of the stress and/or strain measurement cell. In the example of FIGS. 4A to 4C, angle-dependent stress differences $\Delta a = i_{1a} - i_{2a}$ and $\Delta b = i_{1b} - i_{2b}$ are calculated as output signals for this purpose.

Although, in the example of FIGS. 4Aa-4Ac, a first stress direction 30a of a stress σ exerted on the semiconductor device 24 is oriented perpendicular to a second stress direction 30b of the stress σ exerted in the example of FIGS. 4Ba-4Bc, while a third stress direction 30c of the stress σ of the example of FIGS. 4Ca-4Cc is located between the first stress direction 30a and the second stress direction 30b, a comparison of FIGS. 4Ac to 4Cc reveals that the stress and/or strain measurement cells 10a and 10b have elevated sensitivity for all stress directions 30a to 30c due to the different orientations of their definable first crystal directions $n_{1a}$ and $n_{1b}$ and their definable second crystal directions $n_{2a}$ and $n_{2b}$. By configuring the current mirror circuits of the stress and/or strain measurement cells 10a and 10b as cascoded current mirror circuits, it is also possible to ensure sufficient stability of their power supply so that reliable measurements can be carried out. An item of information relating to a stress and/or strain distribution on and/or in the at least one part of the semiconductor device 24 can thus reliably be determined as a direction-dependent item of stress and/or strain information 28 on the basis of the output signals Δa and Δb.

What is claimed is:

1. A stress and/or strain measurement cell for a stress and/or strain measurement system, comprising:
    a reference contact at which a reference current signal of the stress and/or strain measurement cell is provided;
    a sensor contact at which a sensor current signal of the stress and/or strain measurement cell is provided; and
    a first current mirror circuit integrated into a semiconductor material and having a first conduction path connectable or connected to the reference contact and a second conduction path connectable or connected to the sensor contact, wherein the first conduction path of the first current mirror circuit includes at least one first transistor, and the second conduction path of the first current mirror circuit includes at least one second transistor, a first gate terminal of the first transistor, a first drain terminal of the first transistor and a second gate terminal of the second transistor are at an identical potential;
    wherein a first crystal direction of the semiconductor material oriented perpendicular to a first inversion channel of the first transistor is definable for the first inversion channel, and a second crystal direction of the semiconductor material oriented perpendicular to a second inversion channel of the second transistor is definable for the second inversion channel, wherein the first crystal direction of the semiconductor material is inclined relative to the second crystal direction of the semiconductor material,
    wherein the first conduction path of the first current mirror circuit further includes a third transistor connected to the first drain terminal of the first transistor, and the second conduction path of the first current mirror circuit further includes a fourth transistor connected to a second drain terminal of the second transistor, and
    wherein a third gate terminal of the third transistor, a third drain terminal of the third transistor and a fourth gate terminal of the fourth transistor are at an identical potential,
    wherein a third crystal direction of the semiconductor material oriented perpendicular to a third inversion channel of the third transistor, which is also oriented perpendicular to a fourth inversion channel of the fourth transistor, is definable for the third inversion channel.

2. The stress and/or strain measurement cell as recited in claim 1, further comprising:
    a second current mirror circuit integrated into the semiconductor material with a third conduction path connectable or connected to the reference contact or to a further reference contact and with a fourth conduction path connectable or connected to the sensor contact or to a further sensor contact, the third conduction path of the second current mirror circuit including at least one fifth transistor, and the fourth conduction path of the second current mirror circuit including at least one sixth transistor;
    wherein a fifth gate terminal of the fifth transistor, a fifth drain terminal of the fifth transistor and a sixth gate terminal of the sixth transistor are at an identical potential;
    wherein a fifth crystal direction of the semiconductor material oriented perpendicular to a fifth inversion channel of the fifth transistor is definable for the fifth inversion channel, and a sixth crystal direction of the semiconductor material oriented perpendicular to a sixth inversion channel of the sixth transistor is definable for the sixth inversion channel, the fifth crystal direction of the semiconductor material being inclined relative to the sixth crystal direction of the semiconductor material, and
    wherein the fifth crystal direction of the semiconductor material is inclined relative to the first crystal direction of the semiconductor material and/or the sixth crystal direction of the semiconductor material is inclined relative to the second crystal direction of the semiconductor material.

3. The stress and/or strain measurement cell as recited in claim 2, wherein the third conduction path of the second current mirror circuit further includes a seventh transistor connected to the fifth drain terminal of the fifth transistor and the fourth conduction path of the second current mirror circuit further includes an eighth transistor connected to a sixth drain terminal of the sixth transistor, and wherein a seventh gate terminal of the seventh transistor, a seventh drain terminal of the seventh transistor, and an eighth gate terminal of the eighth transistor are at an identical potential.

4. The stress and/or strain measurement cell as recited in claim 3, wherein a seventh crystal direction of the semiconductor material oriented perpendicular to a seventh inversion channel of the seventh transistor, which is also oriented perpendicular to an eighth inversion channel of the eighth transistor, is definable for the seventh inversion channel.

5. The stress and/or strain measurement cell as recited in claim 2, further comprising:
    a switch device configured such that, when the switch device is in a first switching state, the first conduction path of the first current mirror circuit is connected to the reference contact and the second conduction path of the first current mirror circuit is connected to the sensor contact and, when the switch device is in a second switching state, the third conduction path of the second current mirror circuit is connected to the reference contact and the fourth conduction path of the second current mirror circuit is connected to the sensor contact.

6. The stress and/or strain measurement cell as recited in claim 1, wherein each of the first transistor and/or the second transistor is a MOSFET.

7. The stress and/or strain measurement cell as recited in claim 1, wherein each of the first transistor and/or the second transistor, and/or the third transistor and/or the fourth transistor is a MOSFET.

8. The stress and/or strain measurement cell as recited in claim 3, wherein each of the fifth transistor and/or the sixth transistor and/or the seventh transistor and/or the eighth transistor, is a MOSFET.

9. A stress and/or strain measurement system for a semiconductor device, comprising:
- at least one stress and/or strain measurement cell, each including:
  - a reference contact at which a reference current signal of the stress and/or strain measurement cell is provided,
  - a sensor contact at which a sensor current signal of the stress and/or strain measurement cell is provided, and
  - a first current mirror circuit integrated into a semiconductor material and having a first conduction path connectable or connected to the reference contact and a second conduction path connectable or connected to the sensor contact, wherein the first conduction path of the first current mirror circuit includes at least one first transistor, and the second conduction path of the first current mirror circuit includes at least one second transistor, a first gate terminal of the first transistor, a first drain terminal of the first transistor and a second gate terminal of the second transistor are at an identical potential,
  - wherein a first crystal direction of the semiconductor material oriented perpendicular to a first inversion channel of the first transistor is definable for the first inversion channel, and a second crystal direction of the semiconductor material oriented perpendicular to a second inversion channel of the second transistor is definable for the second inversion channel, wherein the first crystal direction of the semiconductor material is inclined relative to the second crystal direction of the semiconductor material;
- wherein the semiconductor material of the stress and/or strain measurement cell is arrangeable or arranged on and/or in the semiconductor device at a respective sensor position of the stress and/or strain measurement cell; and
- an electronic device configured and/or programed to determine, at least based on the reference current signal provided at the reference contact of the stress and/or strain measurement cell and of the sensor current signal provided at the sensor contact of the stress and/or strain measurement cell, a direction-dependent item of stress and/or strain information for at least the sensor position of the stress and/or strain measurement cell,
- wherein the first conduction path of the first current mirror circuit further includes a third transistor connected to the first drain terminal of the first transistor, and the second conduction path of the first current mirror circuit further includes a fourth transistor connected to a second drain terminal of the second transistor, and wherein a third gate terminal of the third transistor, a third drain terminal of the third transistor and a fourth gate terminal of the fourth transistor are at an identical potential,
- wherein a third crystal direction of the semiconductor material oriented perpendicular to a third inversion channel of the third transistor, which is also oriented perpendicular to a fourth inversion channel of the fourth transistor, is definable for the third inversion channel.

10. The stress and/or strain measurement system as recited in claim 9, wherein the stress and/or strain measurement system includes a plurality of stress and/or strain measurement cells as the at least one stress and/or strain measurement cell, wherein the respective semiconductor material of the stress and/or strain measurement cells is arranged on and/or in at least one part of the semiconductor device at a plurality of sensor positions, and wherein the electronic device is configured and/or programed to determine, based on the reference current signals provided at the reference contacts and of the sensor current signals provided at the sensor contacts, an item of information relating to a stress and/or strain distribution on and/or in the at least one part of the semiconductor device as a direction-dependent item of stress and/or strain information.

11. A method for determining a direction-dependent item of stress and/or strain information for at least one sensor position of a semiconductor device, the method comprising the following steps:
- arranging at least one stress and/or strain measurement cell including a reference contact, a sensor contact, and a first current mirror circuit integrated into a semiconductor material and having a first conduction path connectable or connected to the reference contact and a second conduction path connectable or connected to the sensor contact, the first conduction path of the first current mirror circuit including at least one first transistor and the second conduction path of the first current mirror circuit including at least one second transistor, wherein a first gate terminal of the first transistor, a first drain terminal of the first transistor, and a second gate terminal of the second transistor, are at an identical potential, and wherein a first crystal direction of the semiconductor material oriented perpendicular to a first inversion channel of the first transistor is definable for the first inversion channel, and a second crystal direction of the semiconductor material oriented perpendicular to a second inversion channel of the second transistor is definable for the second inversion channel and the first crystal direction of the semiconductor material is inclined relative to the second crystal direction of the semiconductor material, in such a manner that, at least at the sensor position, the semiconductor material of the stress and/or strain measurement cell is located on and/or in the semiconductor device at the sensor position; and
- determining the direction-dependent item of stress and/or strain information for at least the sensor position of the stress and/or strain measurement cell at least based on a reference current signal provided at the reference contact of the stress and/or strain measurement cell and a sensor current signal provided at the sensor contact of the stress and/or strain measurement cell,
- wherein the first conduction path of the first current mirror circuit further includes a third transistor connected to the first drain terminal of the first transistor, and the second conduction path of the first current mirror circuit further includes a fourth transistor connected to a second drain terminal of the second transistor, and wherein a third gate terminal of the third transistor, a third drain terminal of the third transistor and a fourth gate terminal of the fourth transistor are at an identical potential, wherein a third crystal direction of the semiconductor material oriented perpendicular to a third inversion channel of the third transistor, which is also oriented perpendicular to a fourth inversion channel of the fourth transistor, is definable for the third inversion channel.

12. The method as recited in claim 11, wherein a plurality of stress and/or strain measurement cells is arranged as the at least one stress and/or strain measurement cell in such a manner that the respective semiconductor material of the stress and/or strain measurement cells is located on and/or in at least one part of semiconductor device at a plurality of sensor positions, and wherein an item of information relating to a stress and/or strain distribution on and/or in the at least one part of the semiconductor device is determined based on the reference current signals provided at the reference contacts and the sensor current signals provided at the sensor contacts as a direction-dependent item of stress and/or strain information.

* * * * *